US012615746B1

(12) United States Patent
Clark et al.

(10) Patent No.: US 12,615,746 B1
(45) Date of Patent: Apr. 28, 2026

(54) ELECTRIC MACHINE COOLING PLATE FOR AIRCRAFT POWERPLANT

(71) Applicant: RTX Corporation, Farmington, CT (US)

(72) Inventors: Thomas E. Clark, Wells, ME (US); John Akin, Charlotte, NC (US); Jung Muk Choe, Glastonbury, CT (US); Arnab Roy, West Hartford, CT (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 19/190,245

(22) Filed: Apr. 25, 2025

(51) Int. Cl.
   *H05K 7/20* (2006.01)
   *B22C 9/04* (2006.01)
   *B64D 27/30* (2024.01)

(52) U.S. Cl.
   CPC ............. *H05K 7/2089* (2013.01); *B22C 9/04* (2013.01); *B64D 27/30* (2024.01)

(58) Field of Classification Search
   CPC ...... H05K 7/2089; B64D 27/30; B64D 27/33; B64D 27/24; B22C 9/04
   See application file for complete search history.

(56) References Cited

U.S. PATENT DOCUMENTS

| | | | |
|---|---|---|---|
| 4,712,158 A * | 12/1987 | Kikuchi | H01L 23/473 |
| | | | 257/E23.091 |
| 8,300,412 B2 | 10/2012 | Pal | |
| 9,850,817 B2 | 12/2017 | Pal | |
| 10,201,119 B2 | 2/2019 | Pal | |
| 10,954,814 B2 | 3/2021 | Alstad | |
| 11,412,640 B2 | 8/2022 | Tomescu | |
| 11,414,202 B2 | 8/2022 | Tomescu | |
| 11,852,036 B1 * | 12/2023 | Spangler | F01D 5/189 |
| 12,414,223 B2 * | 9/2025 | Pandey | H05K 1/144 |
| 2010/0242492 A1 | 9/2010 | Sloat | |
| 2018/0209277 A1 * | 7/2018 | Dooley | F01D 5/187 |
| 2020/0095888 A1 * | 3/2020 | Alstad | F28F 13/18 |
| 2022/0238779 A1 * | 7/2022 | Chong | H02K 9/223 |
| 2023/0041836 A1 | 2/2023 | Pal | |

* cited by examiner

*Primary Examiner* — Rodney A Bonnette
(74) *Attorney, Agent, or Firm* — Getz Balich LLC

(57) ABSTRACT

An aircraft powerplant assembly includes a cooling plate and an electric machine controller. The cooling plate includes a fluid cooling circuit internal to a body of the cooling plate. The fluid cooling circuit includes an inlet manifold, an outlet manifold and a plurality of heat exchange passages. Each of the heat exchange passages extends longitudinally along a longitudinal centerline from the inlet manifold to the outlet manifold. A first heat exchange passage is configured with a plurality of first cooling elements arranged longitudinally along its longitudinal centerline. The electric machine controller includes a controller housing and controller circuitry. The controller housing is removably attached to the cooling plate and overlaps the heat exchange passages. The controller circuitry is disposed within an interior of the controller housing. The controller circuitry is in thermal communication with the cooling plate through a wall of the controller housing.

20 Claims, 10 Drawing Sheets

1

ELECTRIC MACHINE COOLING PLATE FOR AIRCRAFT POWERPLANT

BACKGROUND OF THE DISCLOSURE

1. Technical Field

This disclosure relates generally to an aircraft powerplant and, more particularly, to cooling electronics of the aircraft powerplant.

2. Background Information

An aircraft powerplant includes various electronics which may utilize heat dissipation during aircraft powerplant operation. Various heat dissipation systems and methods are known in the art. While these known heat dissipation systems and methods have various benefits, there is still room in the art for improvement.

SUMMARY OF THE DISCLOSURE

According to an aspect of the present disclosure, an assembly is provided for an aircraft powerplant. This assembly includes a cooling plate and an electric machine controller. The cooling plate includes a fluid cooling circuit internal to a body of the cooling plate. The fluid cooling circuit includes an inlet manifold, an outlet manifold and a plurality of heat exchange passages. Each of the heat exchange passages includes a longitudinal centerline and extends longitudinally along the longitudinal centerline from the inlet manifold to the outlet manifold. The heat exchange passages include a first heat exchange passage. The first heat exchange passage is configured with a plurality of first cooling elements arranged longitudinally along the longitudinal centerline of the first heat exchange passage. The electric machine controller includes a controller housing and controller circuitry. The controller housing is removably attached to the cooling plate and overlaps the heat exchange passages. The controller circuitry is disposed within an interior of the controller housing. The controller circuitry is in thermal communication with the cooling plate through a wall of the controller housing.

According to another aspect of the present disclosure, another assembly is provided for an aircraft powerplant. This assembly includes a cooling plate and an electric machine controller. The cooling plate includes a fluid cooling circuit internal to a monolithic body of the cooling plate. The fluid cooling circuit includes an inlet manifold, an outlet manifold and a plurality of heat exchange passages. Each of the heat exchange passages includes a longitudinal centerline and extends longitudinally along the longitudinal centerline from the inlet manifold to the outlet manifold. The heat exchange passages include a first heat exchange passage. The longitudinal centerline of the first heat exchange passage follows a serpentine trajectory. A lateral width of the first heat exchange passage changes as the first heat exchange passage extends longitudinally along the longitudinal centerline of the first heat exchange passage between the inlet manifold and the outlet manifold. The electric machine controller includes a controller housing and controller circuitry. The controller housing is attached to the cooling plate. The controller circuitry is disposed within an interior of the controller housing and overlaps the heat exchange passages. The controller circuitry is in thermal communication with the cooling plate through an interface between the electric machine controller and the cooling plate.

According to still another aspect of the present disclosure, a method of manufacture is provided during which a metal cooling plate is formed for an aircraft powerplant using investment casting to provide the metal cooling plate with a cast monolithic body. The metal cooling plate includes a fluid cooling circuit internal to the cast monolithic body. The fluid cooling circuit includes an inlet manifold, an outlet manifold and a plurality of heat exchange passages. Each of the heat exchange passages includes a longitudinal centerline and extends longitudinally along the longitudinal centerline from the inlet manifold to the outlet manifold. The heat exchange passages include a first heat exchange passage. The first heat exchange passage is configured with a plurality of first cooling elements arranged longitudinally along the longitudinal centerline of the first heat exchange passage. The metal cooling plate is configured to support an electric machine controller. The electric machine controller includes a controller housing and controller circuitry. The controller housing is removably attached to the metal cooling plate and overlaps the heat exchange passages. The controller circuitry is disposed within an interior of the controller housing. The controller circuitry is configurable in thermal communication with the metal cooling plate through a wall of the controller housing when supported by the metal cooling plate.

The body of the cooling plate may be a monolithic body.

The longitudinal centerline of the first heat exchange passage may follow a tortuous trajectory.

The first heat exchange passage may include a first augmented flow section, a second augmented flow section and an intermediate flow section. The first augmented flow section may be configured with a first set of the first cooling elements. The second augmented flow section may be configured with a second set of the first cooling elements. The intermediate flow section may be longitudinally between the first augmented flow section and the second augmented flow section.

A longitudinal length of the intermediate flow section along the longitudinal centerline of the first heat exchange passage may be greater than: a longitudinal inter-element distance between a neighboring pair of the first cooling elements disposed in the first set of the first cooling elements; and/or a longitudinal inter-element distance between a neighboring pair of the first cooling elements disposed in the second set of the first cooling elements.

The intermediate flow section may be configured without any cooling elements.

A minimum lateral width of the intermediate flow section along the longitudinal centerline of the first heat exchange passage may be less than: a minimum lateral width of the first augmented flow section along the longitudinal centerline of the first heat exchange passage; and/or a minimum lateral width of the second augmented flow section along the longitudinal centerline of the first heat exchange passage.

A lateral width of the intermediate flow section may decrease as the intermediate flow section extends longitudinally along the longitudinal centerline of the first heat exchange passage away from the first augmented flow section towards the second augmented flow section.

The intermediate flow section may overlap the second augmented flow section within the body of the cooling plate.

A lateral width of the first heat exchange passage may decrease, then increase and then decrease as the first heat exchange passage extends longitudinally away from the inlet manifold and towards outlet manifold.

A lateral width of the first heat exchange passage may decrease, then increase, then decrease, then increase and then decrease as the first heat exchange passage extends longitudinally away from the inlet manifold and towards outlet manifold.

The first heat exchange passage may include a first passage leg, a second passage leg and a third passage leg longitudinally between and fluidly coupling the first passage leg and the second passage leg. The third passage leg may overlap the first passage leg and the second passage leg along a first direction. The third passage leg may be between the first passage leg and the second passage leg along a second direction that is perpendicular to the first direction.

The cooling plate may have an exterior surface. The heat exchange passages may define a heat exchange region along the exterior surface. A shape of the heat exchange region may match a shape of a portion of the electric machine controller that engages the exterior surface in a reference plane parallel to the exterior surface; and/or an area of the heat exchange region may be within ten percent of an area of the portion of the electric machine controller that engages the exterior surface in the reference plane.

The cooling plate may have an exterior surface that engages the electric machine controller. The heat exchange passages may define a heat exchange region along the exterior surface. A shape of the heat exchange region may match a shape of a circuit board of the controller circuitry in a reference plane parallel to the exterior surface; and/or an area of the heat exchange region may be within ten percent of an area of the circuit board of the controller circuitry in the reference plane.

The cooling plate may also include a second inlet manifold, a second outlet manifold and a plurality of second heat exchange passages. Each of the second heat exchange passages may extend longitudinally from the second inlet manifold to the second outlet manifold. The controller circuitry may include a first circuit board and a second circuit board. The first circuit board may overlap the heat exchange passages. The second circuit board may overlap the second heat exchange passages.

The assembly may also include a second electric machine controller including a second controller housing and second controller circuitry. The cooling plate may also include a second inlet manifold, a second outlet manifold and a plurality of second heat exchange passages. Each of the second heat exchange passages may extend longitudinally from the second inlet manifold to the second outlet manifold. The second controller housing may be removably attached to the cooling plate and may overlap the second heat exchange passages. The second controller circuitry may be disposed within an interior of the second controller housing. The second controller circuitry may be in thermal communication with the cooling plate through a wall of the second controller housing.

The assembly may also include a cooling system including the cooling plate, a heat exchanger and a cooling loop. The cooling loop may include and extend through the fluid cooling circuit and one or more passages within the heat exchanger. The cooling system may be configured to circulate a cooling fluid through the cooling loop between the cooling plate and the heat exchanger.

The assembly may also include an electrical system and an electric machine electrically coupled to the electrical system through the electric machine controller. The controller circuitry may be configured to control a flow of electricity between the electrical system and the electric machine.

The assembly may also include an engine core and an electric machine. The engine core may include a flowpath, a compressor section, a combustor section, a turbine section and an engine rotating structure. The flowpath may extend through the compressor section, the combustor section and the turbine section. The engine rotating structure may include a first bladed rotor disposed in the compressor section or the turbine section. The electric machine may be electrically coupled to the electric machine controller. The electric machine may include an electric machine rotor operatively coupled to and rotatable with the engine rotating structure.

The assembly may also include a fan rotor and a fan case housing the fan rotor. The cooling plate may be mounted to the fan case with an air gap formed by and extending radially between the fan case and the cooling plate.

The present disclosure may include any one or more of the individual features disclosed above and/or below alone or in any combination thereof.

The foregoing features and the operation of the invention will become more apparent in light of the following description and the accompanying drawings.

DETAILED DESCRIPTION

Figure 1:
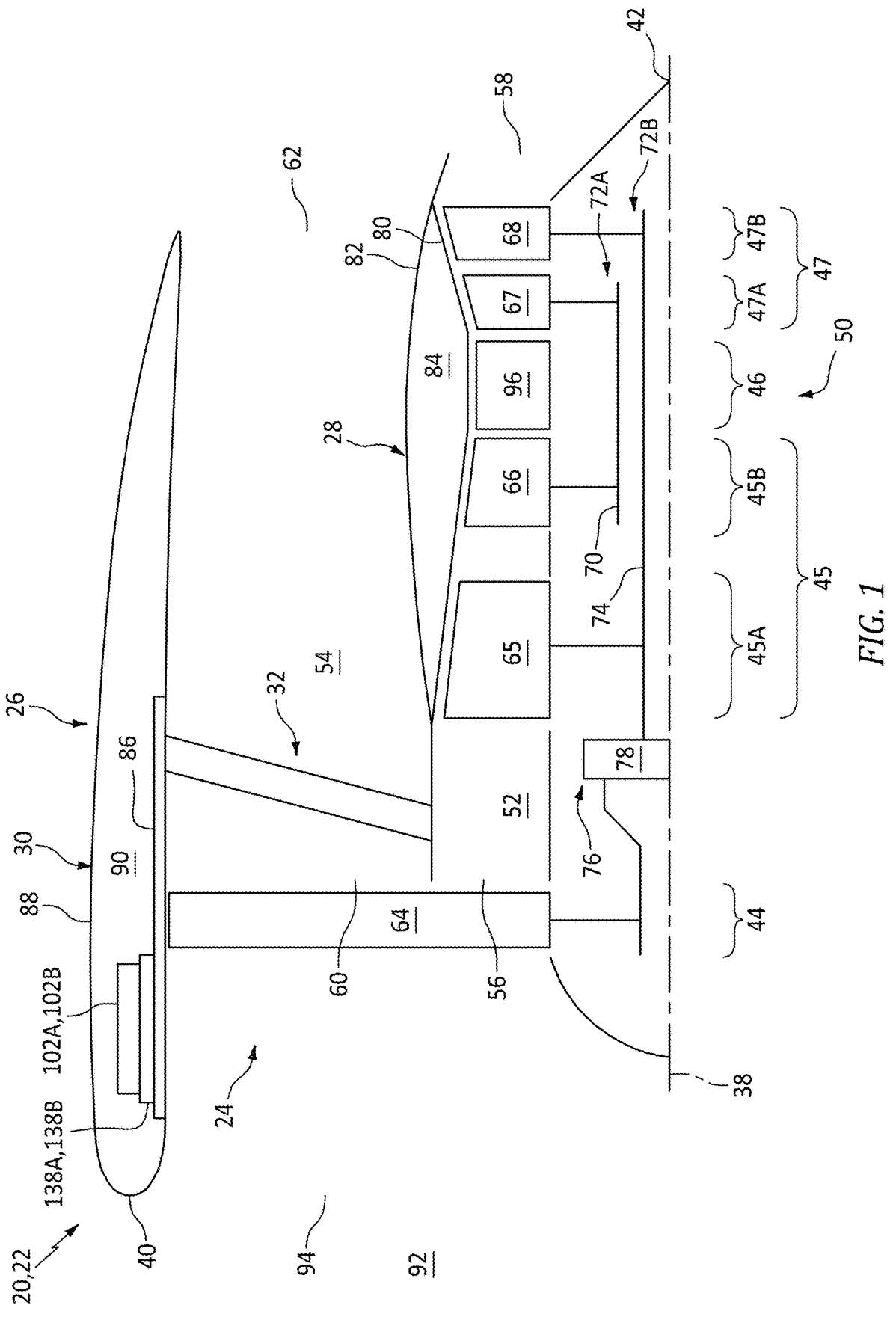
FIG. 1 is a partial schematic illustration of an aircraft propulsion system.

FIG. 1 illustrates a powerplant 20 for an aircraft. The aircraft may be an airplane, a drone (e.g., an unmanned aerial vehicle (UAV)) or any other manned or unmanned aerial vehicle or system. For ease of description, the aircraft powerplant 20 is described below as a propulsion system 22 for the aircraft and, more particularly, as a turbofan propulsion system. The aircraft powerplant 20 of the present disclosure, however, is not limited to such an exemplary propulsion system. The aircraft propulsion system 22, for example, may alternatively be configured as a turbojet propulsion system, a turboprop propulsion system, a turboshaft propulsion system, a propfan propulsion system, a pusher fan propulsion system, or any other type of ducted and/or open propulsor rotor propulsion system. Moreover, the aircraft powerplant 20 is not limited to propulsion system applications. The aircraft powerplant 20, for example, may also (or alternatively) be configured as an electrical power system for the aircraft; e.g., an auxiliary power unit (APU).

The aircraft propulsion system 22 includes a gas turbine engine 24 (e.g., a turbofan engine) housed within a stationary propulsion system housing 26, which propulsion system housing 26 of FIG. 1 includes an inner housing structure 28, an outer housing structure 30 and a guide vane structure 32 (e.g., a fan exit guide vane (FEGV) structure) extending radially between and connected to the inner housing structure 28 and the outer housing structure 30. The aircraft propulsion system 22 also includes an electric machine system 34 (see FIG. 2) and a fluid cooling system 36 (see FIG. 3). The aircraft propulsion system 22 extends axially along an axis 38 of the aircraft propulsion system 22 between an axial upstream, forward end 40 of the aircraft propulsion system 22 and an axial downstream, aft end 42 of the aircraft propulsion system 22. Briefly, the propulsion system axis 38 may be a centerline axis of the aircraft propulsion system 22, the turbine engine 24 and/or one or more of its members. The propulsion system axis 38 may also or alternatively be a rotational axis for one or more members of the turbine engine 24.

The aircraft propulsion system 22 and its turbine engine 24 of FIG. 1 include a propulsor section 44 (e.g., a fan section), a compressor section 45, a combustor section 46 and a turbine section 47. The compressor section 45 of FIG. 1 includes a low pressure compressor (LPC) section 45A and a high pressure compressor (HPC) section 45B. The turbine section 47 of FIG. 1 includes a high pressure turbine (HPT) section 47A and a low pressure turbine (LPT) section 47B. At least (or only) the LPC section 45A, the HPC section 45B, the combustor section 46, the HPT section 47A and the LPT section 47B collectively form a core 50 (e.g., a gas generator) of the turbine engine 24. The aircraft propulsion system 22 and its turbine engine 24 of FIG. 1 also include a core flowpath 52 (e.g., an annular core flowpath) and a bypass flowpath 54 (e.g., an annular bypass flowpath). The core flowpath 52 extends sequentially through the LPC section 45A, the HPC section 45B, the combustor section 46, the HPT section 47A and the LPT section 47B from an airflow inlet 56 into the core flowpath 52 to a combustion products exhaust 58 out from the core flowpath 52. The bypass flowpath 54 extends through a bypass duct from an airflow inlet 60 into the bypass flowpath 54 to an airflow exhaust 62 from the bypass flowpath 54, where the bypass duct may be formed by the inner housing structure 28 and the outer housing structure 30. The bypass flowpath 54 and its bypass duct are configured to bypass (e.g., are disposed radially outboard of and extend along) the engine core 50 and the inner housing structure 28.

The propulsor section 44, the LPC section 45A, the HPC section 45B, the combustor section 46, the HPT section 47A and the LPT section 47B may be arranged sequentially along the propulsion system axis 38 within the propulsion system housing 26. The propulsor section 44 includes a bladed propulsor rotor 64; e.g., a fan rotor. The LPC section 45A includes a bladed low pressure compressor (LPC) rotor 65. The HPC section 45B includes a bladed high pressure compressor (HPC) rotor 66. The HPT section 47A includes a bladed high pressure turbine (HPT) rotor 67. The LPT section 47B includes a bladed low pressure turbine (LPT) rotor 68. Each of these engine rotors 64-68 includes a rotor base (e.g., a disk or a hub) and a plurality of rotor blades (e.g., airfoils, vanes, etc.). The rotor blades may be arranged into one or more stages axially along the respective engine rotor 64-68. The rotor blades in each stage are arranged and may be equispaced circumferentially around the respective rotor base in an annular array. Each of the rotor blades is connected to the respective rotor base. The rotor blades, for example, may be formed integral with or mechanically fastened, welded, brazed and/or otherwise attached to the respective rotor base. Each of the rotor blades projects spanwise (e.g., radially) out from the respective rotor base to a distal tip of the respective rotor blade.

The HPC rotor 66 is coupled to and rotatable with the HPT rotor 67. The HPC rotor 66 of FIG. 1, for example, is connected to the HPT rotor 67 through a high speed shaft 70. At least (or only) the HPC rotor 66, the HPT rotor 67 and the high speed shaft 70 collectively form a high speed rotating structure 72A; e.g., a high speed spool of the turbine engine 24 and its engine core 50. This high speed rotating structure 72A of FIG. 1 and its members 66, 67 and 70 are rotatable about the propulsion system axis 38. However, it is contemplated the high speed rotating structure 72A may alternatively be rotatable about another axis radially and/or angularly offset from the rotational axis of the propulsor rotor 64 and/or the centerline axis of the turbine engine 24.

The LPC rotor 65 is coupled to and rotatable with the LPT rotor 68. The LPC rotor 65 of FIG. 1, for example, is connected to the LPT rotor 68 through a low speed shaft 74. At least (or only) the LPC rotor 65, the LPT rotor 68 and the low speed shaft 74 collectively form a low speed rotating structure 72B; e.g., a low speed spool of the turbine engine 24 and its engine core 50. This low speed rotating structure 72B of FIG. 1 and its members 65, 68 and 74 are rotatable about the propulsion system axis 38. However, it is contemplated the low speed rotating structure 72B may alternatively be rotatable about another axis radially and/or angularly offset from the rotational axis of the propulsor rotor 64 and/or the centerline axis of the turbine engine 24.

The low speed rotating structure 72B is coupled to the propulsor rotor 64 through a rotating structure-to-propulsor (RSP) drivetrain 76. The RSP drivetrain 76 may be configured as a geared drivetrain, where a geartrain 78 (e.g., a transmission, a speed change device, an epicyclic geartrain, etc.) is disposed between and operatively couples the propulsor rotor 64 to the low speed rotating structure 72B and its LPT rotor 68. With this arrangement, the propulsor rotor 64 may rotate at a different (e.g., slower) rotational speed than the low speed rotating structure 72B and its LPT rotor 68. Here, the propulsor rotor 64 and the low speed rotating structure 72B may rotate in a common (the same) direction about the propulsion system axis 38 or in opposite directions about the propulsion system axis 38 depending, for example, upon the specific configuration of the geartrain 78. Alternatively, the RSP drivetrain 76 may be configured as a direct-drive drivetrain, where the geartrain 78 is omitted. With such an arrangement, the propulsor rotor 64 rotates at a common (the same) rotational speed as the low speed rotating structure 72B and its LPT rotor 68.

The inner housing structure 28 of FIG. 1 includes an inner case 80 (e.g., a core case) for the turbine engine 24, an inner nacelle structure 82 (sometimes referred to as an inner fixed structure (IFS)) and an internal inner housing compartment 84 (e.g., an engine core compartment). The inner case 80 is disposed radially outboard of, extends axially along and may circumscribe one or more or all of the engine sections 45A-47B and the engine rotors 65-68. The inner case 80 may thereby house and provide a support structure for the respective engine sections 45A-47B and the engine rotors 65-68. The inner nacelle structure 82 is configured to provide an aerodynamic cover over the engine core 50 and its inner case 80. The inner housing compartment 84 of FIG. 1 is formed by and is disposed radially between the inner case 80 and an inner barrel of the inner nacelle structure 82. The inner housing structure 28 and its inner nacelle structure 82 may also form a radial inner peripheral boundary of the bypass flowpath 54.

The outer housing structure 30 of FIG. 1 includes an outer case 86 (e.g., a fan case) for the turbine engine 24, an outer nacelle structure 88 and an internal outer housing compartment 90. The outer case 86 is disposed radially outboard of, extends axially along and may circumscribe the propulsor section 44 and its propulsor rotor 64. The outer case 86 may thereby house and may be configured as a containment structure for the propulsor section 44 and its propulsor rotor 64. The outer nacelle structure 88 is configured to provide an aerodynamic cover over the outer case 86. The outer housing compartment 90 of FIG. 1 is at least partially formed by and disposed radially between the outer case 86 and an outer portion (e.g., fan cowls) of the outer nacelle structure 88. The outer housing structure 30 and its outer nacelle structure 88 may also form a radial outer peripheral boundary of the bypass flowpath 54.

During operation of the aircraft propulsion system 22 of FIG. 1, ambient air from an environment 92 external to the aircraft and its aircraft propulsion system 22 enters the aircraft propulsion system 22 and its turbine engine 24 through an airflow inlet 94. This air is propelled by the rotating propulsor rotor 64 in a downstream, aft direction towards the propulsion system aft end 42.

An outer stream of the air propelled by the rotating propulsor rotor 64 is directed into the bypass flowpath 54 through its bypass inlet 60, which air entering the bypass flowpath 54 may be referred to as "bypass air". The guide vane structure 32 conditions (e.g., straightens out, de-swirls, etc.) the flow of the bypass air within the bypass duct. This conditioned bypass air is subsequently directed out of the aircraft propulsion system 22 through the bypass exhaust 62 to provide forward thrust. This propulsion of the bypass air may account for a majority of the forward thrust generated by the aircraft propulsion system 22 and its turbine engine 24 of FIG. 1.

An inner stream of the air propelled by the rotating propulsor rotor 64 is directed into the core flowpath 52 through its core inlet 56, which air entering the core flowpath 52 may be referred to as "core air". This core air is compressed by the LPC rotor 65 and the HPC rotor 66 and is directed into a combustion chamber 96 (e.g., annular combustion chamber) of a combustor (e.g., annular combustor) in the combustor section 46. Fuel is injected into the combustion chamber 96 by one or more fuel injectors and mixed with the compressed core air to provide a fuel-air mixture. This fuel-air mixture is ignited and combustion products thereof flow through and sequentially drive rotation of the HPT rotor 67 and the LPT rotor 68. The rotation of the HPT rotor 67 and the LPT rotor 68 respectively drive rotation of the HPC rotor 66 and the LPC rotor 65 and, thus, compression of the air received from the core inlet 56. The rotation of the LPT rotor 68 also drives rotation of the propulsor rotor 64 through the RSP drivetrain 76.

While the turbine engine 24 is described above with a particular two rotating structure arrangement (e.g., a two-spool architecture), the present disclosure is not limited thereto. For example, the LPC rotor 65 may be omitted to configure the LPT rotor 68 as a power turbine (PT) rotor for the propulsor rotor 64. The turbine engine 24 may also or alternatively include another rotating structure with a bladed compressor rotor in the compressor section 45 and a bladed turbine rotor in the turbine section 47; e.g., an intermediate speed spool for the engine core 50.

Figure 2:
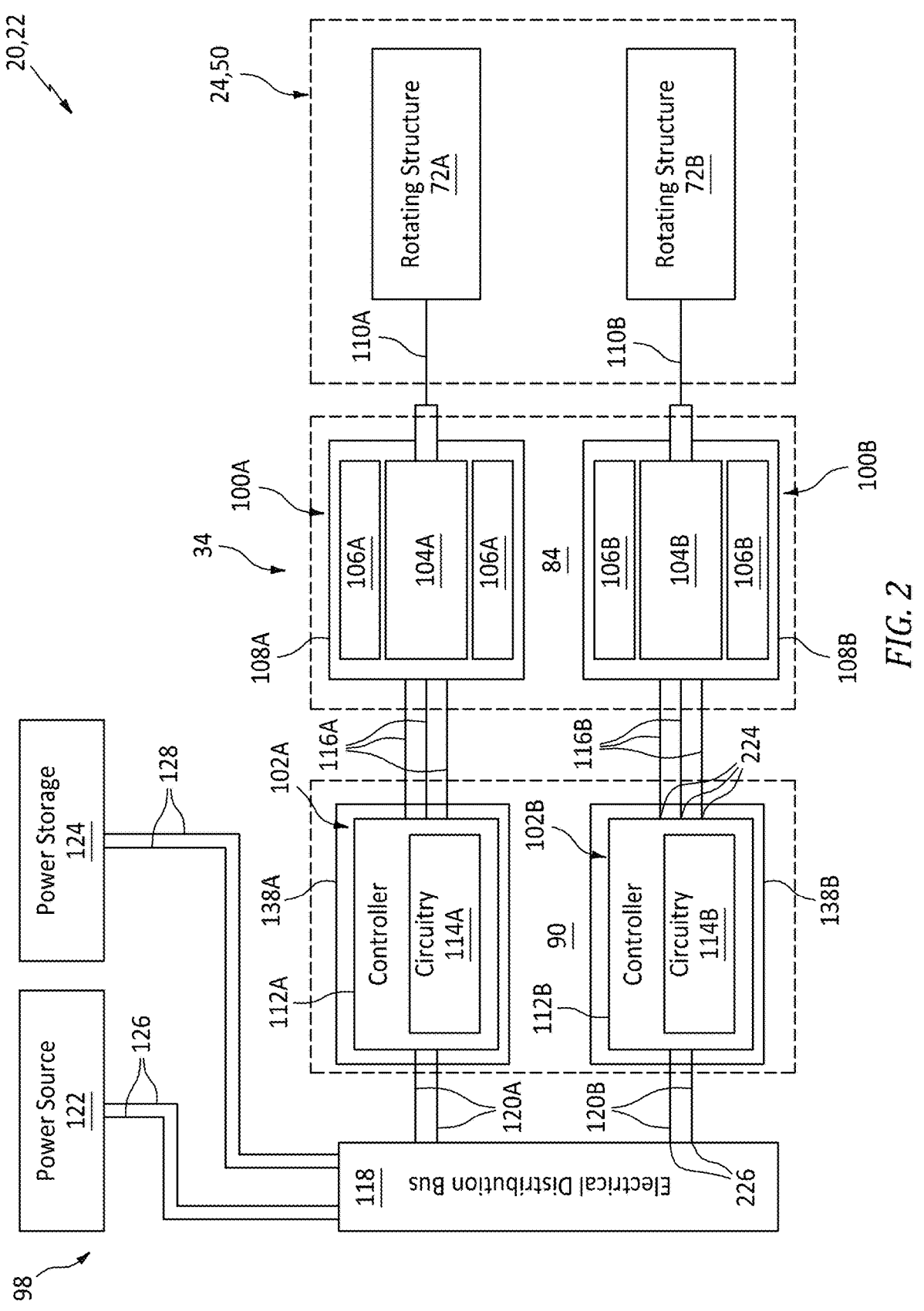
FIG. 2 is a schematic illustration of a portion of the aircraft propulsion system at an electric machine system.

Referring to FIG. 2, the electric machine system 34 is electrically coupled to an electrical system 98 for the aircraft and its aircraft propulsion system 22. The electric machine system 34 of FIG. 2 includes one or more electric machines 100A, 100B (generally referred to as "100") and one or more electric machine (EM) controllers 102A, 102B (generally referred to as "102"). For ease of description, each electric machine 100 of FIG. 2 is described below as being electrically coupled to, controlled by and/or otherwise associated with a single, dedicated one of the EM controllers 102. However, it is contemplated a single EM controller may alternatively be electrically coupled to, may control and/or may otherwise be associated with multiple electric machines. It is also contemplated multiple EM controllers may be electrically coupled to, may control and/or may otherwise be associated with one or more common electric machines.

Each electric machine 100A, 100B of FIG. 2 includes an electric machine rotor 104A, 104B (generally referred to as "104"), an electric machine stator 106A, 106B (generally referred to as "106") and an electric machine housing 108A, 108B (generally referred to as "108"); e.g., a case. The machine rotor 104 is rotatable about a rotational axis of the machine rotor 104, which machine axis may also be an axial centerline of the electric machine 100. The machine stator 106 is disposed next to and in electromagnetic communication with the machine rotor 104. The machine stator 106 of FIG. 2, in particular, is radially outboard of and circumscribes the machine rotor 104. With this arrangement, each electric machine 100 is configured as a radial flux electric machine. The electric machines 100 of the present disclosure, however, are not limited to such an exemplary rotor-stator configuration nor to radial flux arrangements. The machine rotor 104, for example, may alternatively be radially outboard of and circumscribe the machine stator 106. In another example, the machine rotor 104 may be axially next to the machine stator 106 configuring the respective electric machine 100 as an axial flux electric machine. Referring again to FIG. 2, the machine rotor 104 and the machine stator 106 are at least partially or completely housed within an interior of the machine housing 108.

Each electric machine 100 is operatively coupled to the turbine engine 24 and its engine core 50. More particularly, each electric machine 100A, 100B is operatively coupled to a respective one of the engine rotating structures 72A, 72B (generally referred to as "72"). Each machine rotor 104A, 104B of FIG. 2, for example, is mechanically coupled to the respective engine rotating structure 72A, 72B through a respective core-to-electric machine (CEM) drivetrain 110A, 110B (generally referred to as "110"); schematically shown. This CEM drivetrain 110 may be configured as or otherwise include a shaft, a tower shaft assembly, an accessory gearbox, another gearbox (e.g., an angle gearbox), and/or the like. For ease of description, each machine rotor 104 of FIG. 2 is described below as being coupled to and rotatable with a unique one of the engine rotating structures 72 of the aircraft propulsion system 22. However, it is contemplated multiple machine rotors may alternatively be coupled to and rotatable with a common engine rotating structure. It is also contemplated a single one of the machine rotors may be coupled to and rotatable with multiple engine rotating structures, directly or through another device such as a differential or a clutch system.

Each electric machine 100 of FIG. 2 may be configurable as an electric motor and/or an electric generator; e.g., an electric motor-generator. For example, during a motor mode of operation, a respective electric machine 100 may operate as the electric motor to convert electricity received from the aircraft electrical system 98. The machine stator 106, for example, may generate an electromagnetic field with the machine rotor 104 using a current of electricity received from the aircraft electrical system 98 through the respective EM controller 102. This electromagnetic field may drive rotation of the machine rotor 104. The machine rotor 104, in turn, may provide mechanical power to and drive rotation of the respective engine rotating structure 72 through the respective CEM drivetrain 110. This mechanical power may be provided to boost power or completely power the rotation of the respective engine rotating structure 72. By contrast, during a generator mode of operation, a respective electric machine 100 may operate as the electric generator to convert mechanical power received from the respective engine rotating structure 72 into electricity. Rotation of the machine rotor 104, for example, may be rotationally driven by rotation of the respective engine rotating structure 72 through the respective CEM drivetrain 110. The rotation of the machine rotor 104 may generate an electromagnetic field with the machine stator 106, and the machine stator 106 may convert energy from the electromagnetic field into electricity. The respective electric machine 100 may then provide a current of electricity to the aircraft electrical system 98 through the respective EM controller 102 for storage and/or further use. The electric machines 100 of the present disclosure, however, are not limited to such exemplary operation. For example, one, some or all of the electric machines 100 may alternatively each be configured as a dedicated electric generator; e.g., without the electric motor functionality. One, some or all of the electric machines 100 may alternatively each be configured as a dedicated electric motor; e.g., without the electric generator functionality.

Each EM controller 102A, 102B includes a controller housing 112A, 112B (generally referred to as "112") and internal controller circuitry 114A, 114B (generally referred to as "114"). The controller housing 112 may be configured as an enclosed case (e.g., a closed or sealed container) for the respective controller circuitry 114. The controller circuitry 114 is disposed within an interior of the controller housing 112; e.g., an internal chamber or other volume(s) within and enclosed by the controller housing 112. The controller circuitry 114 includes various electrical components, connectors and the like. Examples of the electrical components include, but are not limited to, printed circuit board(s) (PCB(s)), electrical inductor(s), electrical inverter(s), electrical amplifier(s), electrical switch(es) (e.g., contactor(s), relay(s), etc.), a processing device, memory, a communication module, electrical transformer(s), electrical rectifier(s), and/or the like.

Each EM controller 102A, 102B is electrically coupled to a respective one of the electric machines 100A, 100B through one or more electric cables 116A, 116B (generally referred to as "116"); e.g., high voltage electric cables, power feeder cables, etc. More particularly, the controller circuitry 114 of each EM controller 102 is electrically coupled to the respective electric machine 100 and its machine stator 106 through the respective electric cables 116. Similarly, each EM controller 102A, 102B is electrically coupled to an electrical distribution bus 118 of the aircraft electrical system 98 through one or more electric cables 120A, 120B (generally referred to as "120"); e.g., high voltage electric cables, power feeder cables, etc. More particularly, the controller circuitry 114 of each EM controller 102 is electrically coupled to the aircraft electrical system 98 and its electrical distribution bus 118 through the respective electric cables 120.

Each EM controller 102 and its controller circuitry 114 are configured to control operation of a respective one of the electric machines 100. For example, when operating as the electric motor, the respective EM controller 102 and its controller circuitry 114 are configured to regulate a flow of electricity from the aircraft electrical system 98 to the respective electric machine 100. This electricity flow regulation may include: (a) turning-on the flow of electricity from the aircraft electrical system 98 to the respective electric machine 100 (e.g., electrically coupling the respective electric machine 100 to the aircraft electrical system 98); (b) turning-off the flow of electricity from the aircraft electrical system 98 to the respective electric machine 100 (e.g., electrically decoupling the respective electric machine 100 from the aircraft electrical system 98); (c) moderating the flow of electricity from the aircraft electrical system 98 to the respective electric machine 100. Here, the respective EM controller 102 operates as a motor controller. In another example, when operating as the electric generator, the respective EM controller 102 and its controller circuitry 114 are configured to regulate a flow of electricity from the respective electric machine 100 to the aircraft electrical system 98. This electricity flow regulation may include: (a) turning-on the flow of electricity from the respective electric machine 100 to the aircraft electrical system 98 (e.g., electrically coupling the respective electric machine 100 to the aircraft electrical system 98); (b) turning-off the flow of electricity from the respective electric machine 100 to the aircraft electrical system 98 (e.g., electrically decoupling the respective electric machine 100 from the aircraft electrical system 98); (c) moderating the flow of electricity from the respective electric machine 100 to the aircraft electrical system 98. Here, the respective EM controller 102 operates as a generator controller.

The aircraft electrical system 98 includes the electrical distribution bus 118. This aircraft electrical system 98 may also include a power source 122 and/or a power storage 124. The electrical distribution bus 118 is electrically coupled to each of the electric machines 100 through their respective EM controllers 102. The electrical distribution bus 118 is also electrically coupled to the power source 122 and the power storage 124 through one or more respective electric cables 126 and 128; e.g., high voltage electric cables, power feeder cables, etc. Of course, the electrical distribution bus 118 may also be electrically coupled to one or more additional electric components of the aircraft propulsion system 22 and/or one or more additional electric components of the aircraft outside of the aircraft propulsion system 22; e.g., airframe mounted electric components, etc. With this arrangement, the electrical distribution bus 118 provides an intermediate connection between the various electrical members 100A (via 102A), 100B (via 102B), 122 and/or 124. The power source 122 may be an electric generator powered by the turbine engine 24 (see FIG. 1) or an electric generator powered by another aircraft powerplant 20; e.g., an engine of a companion aircraft propulsion system, an engine of an auxiliary power unit (APU), a fuel cell system, etc. The power storage 124 is configured to receive electricity from the electrical distribution bus 118 for storage. The power storage 124 is also configured to provide the stored electricity to the electrical distribution bus 118. The power storage 124, for example, may be configured as or otherwise include one or more electricity storage devices; e.g., batteries, super capacitors, etc. Of course, it is contemplated one or more of the electric machines 100A, 100B (e.g., operating as the electric generator(s)) may also or alternatively operate as a power source for another one or more of the electric machines 100B, 100A (e.g., operating as the electric motor(s)).

Figure 3:
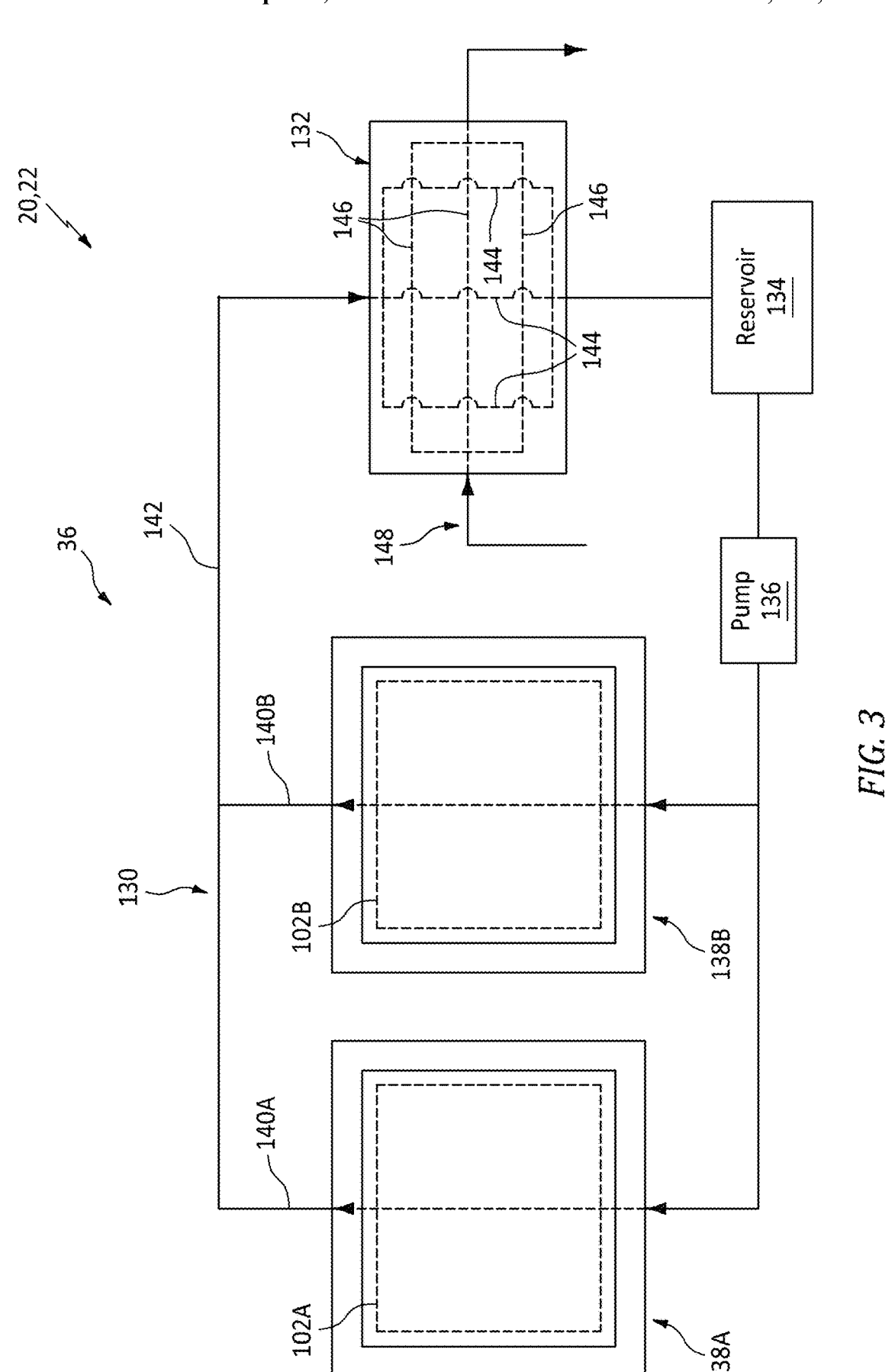
FIG. 3 is a schematic illustration of a portion of the aircraft propulsion system at a fluid cooling system.

During operation of each electric machine 100, the respective EM controller 102 and its controller circuitry 114 may heat up; e.g., generate waste heat energy. To promote efficient EM controller operation and/or prevent EM controller heat-related degradation, a temperature of each EM controller 102 may be regulated (e.g., the heat energy may be dissipated) using the fluid cooling system 36. Referring to FIG. 3, the fluid cooling system 36 includes a cooling system flowpath 130, a heat exchanger 132, a fluid reservoir 134, a fluid pump 136 and one or more fluid cooling plates 138A and 138B (generally referred to as "138").

The cooling system flowpath 130 may be configured as a closed fluid cooling loop. The cooling system flowpath 130 of FIG. 3, for example, includes one or more heat exchange legs 140A and 140B (generally referred to as "140") and a flow leg 142. Each of the heat exchange legs 140 extends longitudinally from an outlet out from the flow leg 142, through a respective one of the cooling plates 138, to an inlet into the flow leg 142. With this arrangement, the heat exchange legs 140 and, thus, the cooling plates 138 of FIG. 3 are fluidly coupled in parallel with one another between the flow leg inlet and the flow leg outlet. However, in other embodiments, it is contemplated the heat exchange legs 140 may alternatively be fluidly coupled in series between the flow leg inlet and the flow leg outlet. Referring again to FIG. 3, the flow leg 142 extends longitudinally from its flow leg inlet/outlets out from the heat exchange legs 140, sequentially through the heat exchanger 132, the fluid reservoir 134 and the fluid pump 136, to its flow leg outlet/inlet into the heat exchange legs 140. H ere, the fluid cooling system 36 may circulate a (e.g., liquid) cooling fluid such as, but not limited to, coolant, lubricant, and/or the like. The present disclosure, however, is not limited to such an exemplary closed loop arrangement. For example, the heat exchanger 132 may alternatively be arranged fluidly inline along the flow leg 142 between the fluid pump 136 and the heat exchange legs 140. In another example, the cooling system flowpath 130 may alternatively be configured as an open fluid cooling loop. With such an open loop arrangement, the cooling system flowpath 130 may not feed back to the fluid reservoir 134. Rather, the cooling system flowpath 130 may supply the cooling fluid to another component (or components) of the aircraft propulsion system 22; e.g., an actuator, an injector, etc. Still alternatively, the fluid reservoir 134 may be replaced by a bleed from a flowpath (e.g., the core flowpath 52) within the aircraft propulsion system 22 or another pressurized air source where the cooling fluid is compressed air; e.g., compressed core air. Moreover, it is contemplated the fluid cooling system 36 may (or may not) also include one or more additional components arranged along the cooling system flowpath 130. Examples of these additional components may include, but are not limited to, filter(s), additional heat exchanger(s), additional pump(s), valve(s), sensor device(s), etc.

The heat exchanger 132 of FIG. 3 includes one or more internal first heat exchange passages 144 and one or more internal second heat exchange passages 146. Each of these heat exchange passages 144, 146 is formed by the heat exchanger 132. The first heat exchange passages 144 collectively form a longitudinal section of the cooling system flowpath 130 and its flow leg 142. The second heat exchange passages 146 collectively form a longitudinal section of a working fluid flowpath 148 for another working fluid system. Briefly, this working fluid system may be configured as part of a thermal management system (TMS) for the turbine engine 24, a lubrication system for the turbine engine 24, a fuel system for the turbine engine 24, a bleed air system for the turbine engine 24, or otherwise. The first heat exchange passages 144 are fluidly discrete from the second heat exchange passages 146 within the heat exchanger 132. The first heat exchange passages 144 and the second heat exchange passages 146 may be arranged to configure the heat exchanger 132 as a crossflow heat exchanger, a counterflow heat exchanger, a parallel flow heat exchanger, or a hybrid heat exchanger with a combination crossflow, counterflow and/or parallel flow arrangement. For ease of description, the heat exchanger 132 may generally be described below as a liquid-to-liquid heat exchanger. However, it is contemplated the heat exchanger 132 may alternatively be configured as a liquid-to-gas heat exchanger or a gas-to-gas heat exchanger depending on the types of cooling and working fluids flowing (e.g., circulated) in the cooling system flowpath 130 and the working fluid flowpath 148.

The fluid reservoir 134 is configured to contain (e.g., store) a quantity of the cooling fluid before, during and/or after cooling system operation. The fluid reservoir 134, for example, may be configured as or otherwise include a tank, a cylinder, a pressure vessel, a bladder or any other type of fluid storage container.

The fluid pump 136 is configured to direct (e.g., circulate) a flow of the cooling fluid in the cooling system flowpath 130. The fluid pump 136 of FIG. 3, for example, is configured to pump a flow of the cooling fluid received from the fluid reservoir 134 through the cooling plates 138 and then the heat exchanger 132 and back to the fluid reservoir 134.

Figure 4:
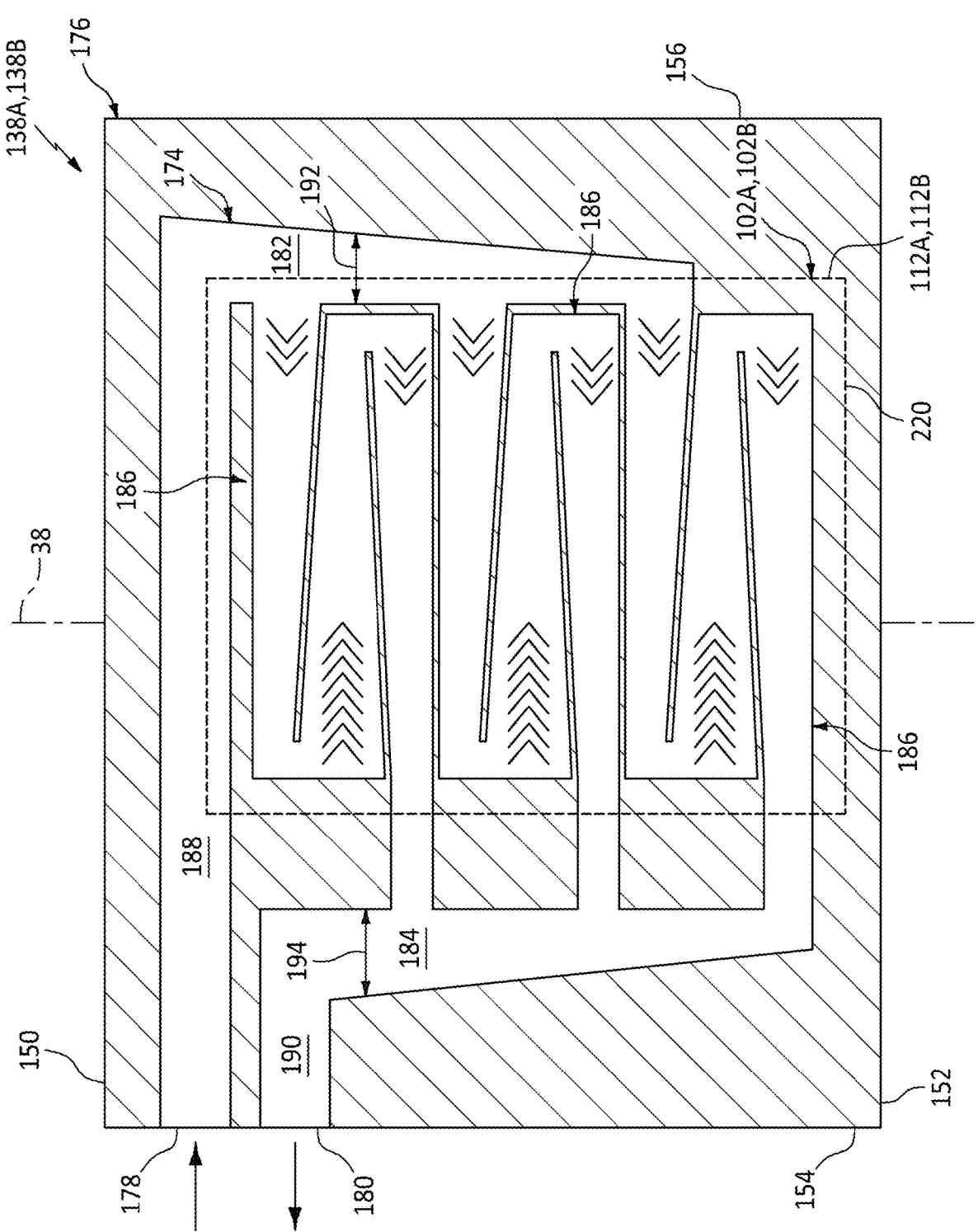
FIG. 4 is a sectional plan view illustration of a fluid cooling plate with an electric machine controller.

FIG. 4 is a sectional plan view illustration of an exemplary one of the cooling plates 138. For ease of description, a vertical direction of FIG. 4 is described below as an axial direction along the propulsion system axis 38. A horizontal direction of FIG. 4 is described below as a circumferential direction about the propulsion system axis 38. A direction perpendicular to the plan view of FIG. 4 is described below as a radial direction relative to the propulsion system axis 38 (see FIG. 5). The present disclosure, however, is not limited to such an exemplary orientation of the respective cooling plate 138 relative to the propulsion system axis 38. For example, it is contemplated one or more of the cooling plates 138 may each be rotated ninety degrees such that the vertical direction of FIG. 4 is the circumferential direction and the horizontal direction of FIG. 4 is the axial direction. Moreover, while the cooling plate 138 is described below as extending circumferentially about the propulsion system axis 38 in the horizontal direction of FIG. 4 providing the cooling plate 138 with an arcuate geometry, it is contemplated the cooling plate 138 may alternatively have a flat planar geometry such that the horizontal direction of FIG. 4 is tangential to a reference circle circumscribing the propulsion system axis 38, for example.

Figure 5:
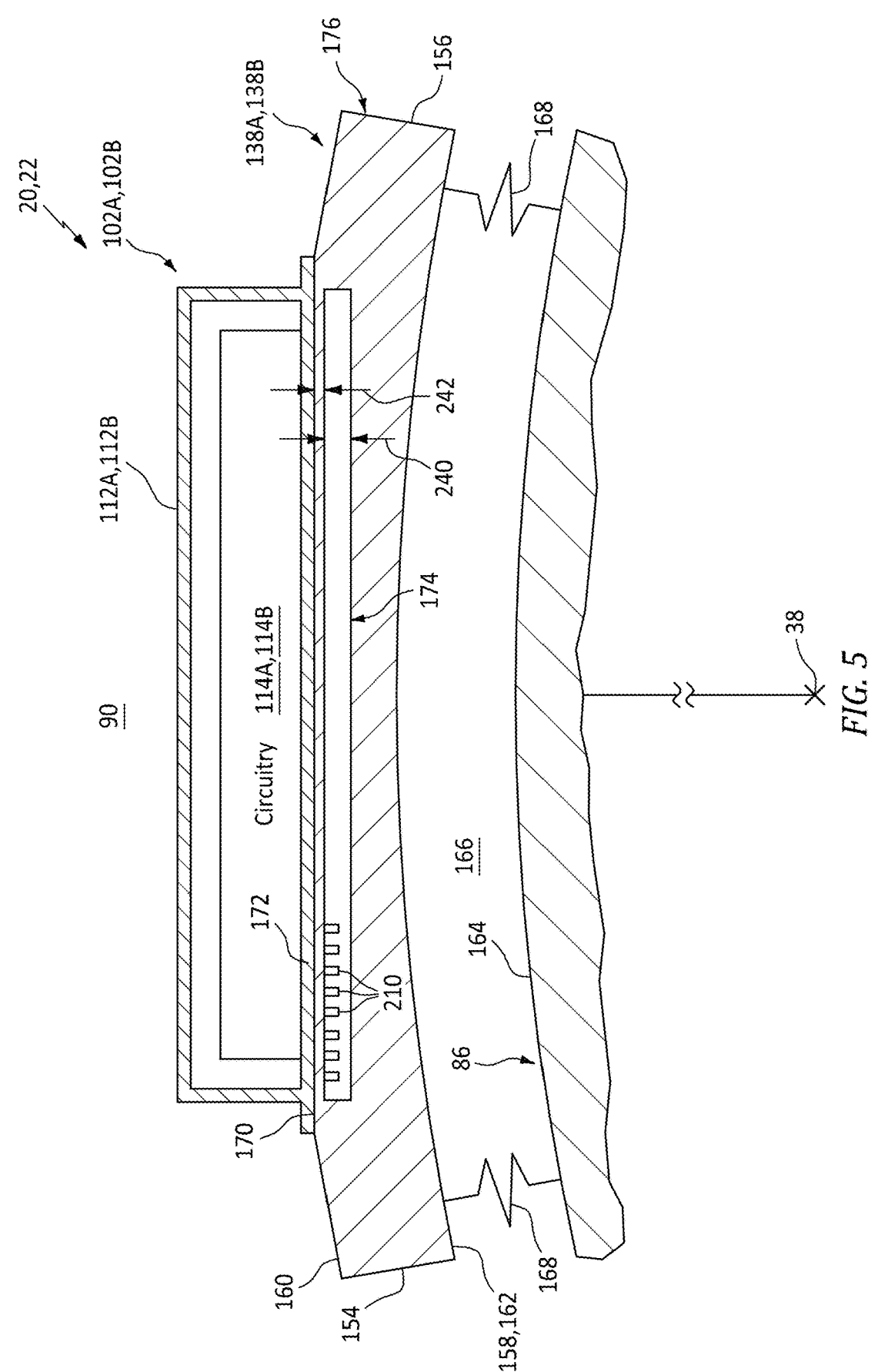
FIG. 5 is a partial cross-sectional illustration of the aircraft propulsion system at the fluid cooling plate.

The cooling plate 138 of FIG. 4 extends axially along the propulsion system axis 38 from an axial first end 150 (e.g., a forward or an aft end) of the cooling plate 138 to an axial second end 152 (e.g., the aft or the forward end) of the cooling plate 138. The cooling plate 138 of FIG. 4 extends circumferentially about (e.g., partially around) the propulsion system axis 38 between and to opposing circumferential sides 154 and 156 of the cooling plate 138. The cooling plate 138 may thereby have an arcuate configuration as shown in FIG. 5. The cooling plate 138 of FIG. 5 extends radially from a radial inner side 158 of the cooling plate 138 to a radial outer side 160 of the cooling plate 138.

At the plate inner side 158, the cooling plate 138 of FIG. 5 has a curved inner surface 162. The plate inner side 158 and its plate inner surface 162 may have geometries (e.g., a cylindrical segment geometry) tailored to substantially match (e.g., conform to, have an identical shape as, etc.) a geometry of a structure to which the cooling plate 138 is mounted. The cooling plate 138 of FIG. 5, for example, is disposed within the outer housing compartment 90 (see also FIG. 1) radially outboard of the outer case 86. This cooling plate 138 is mounted to the outer case 86, and the plate inner side 158 and its plate inner surface 162 may be tailored to match an outer surface 164 of the outer case 86. However, the cooling plate 138 may be spaced radially outboard from the outer case 86 by a radial air gap 166. This air gap 166 may facilitate deformations in the outer case 86 without affecting the cooling plate 138. Moreover, the cooling plate 138 may be flexibly mounted to the outer case 86 to reduce transmission of vibrations from the outer case 86, through the cooling plate 138, into the EM controller 102 mounted therewith. The cooling plate 138 of FIG. 5, for example, is mounted to the outer case 86 through one or more flexible mounts 168; e.g., spring mounts, rubber mounts, etc.

At the plate outer side 160, the cooling plate 138 may include a controller land 170; e.g., an exterior mounting surface. This controller land 170 is configured to mate with a respective one of the EM controllers 102. The controller land 170 of FIG. 5, for example, has a flat planar geometry which matches a flat planar geometry of a bottom wall 172 of a respective one of the controller housings 112. The housing wall 172 may thereby sit on and radially engage (e.g., contact, abut against, lay flush over, etc.) the controller land 170. The EM controller 102 and its controller housing 112 may be removably attached to the respective cooling plate 138, for example by one or more mechanical fasteners; e.g., bolts. With the foregoing arrangement, the EM controller 102 of FIG. 5 is in thermal communication with the respective cooling plate 138. More particularly, the controller circuitry 114 of the EM controller 102 is thermally coupled to the respective cooling plate 138—via conduction—through the respective controller housing 112 and its housing wall 172. This thermal communication may be enhanced by providing a thermal paste or other thermal coupling with high thermal conductivity properties at an interface between the cooling plate 138 and the respective controller housing 112. The present disclosure, however, is not limited to such an exemplary arrangement. For example, the controller land 170 may alternatively be arcuate and the respective controller housing 112 may be configured with a matching arcuate geometry.

Referring to FIG. 4, each cooling plate 138 is configured with a fluid cooling circuit 174. The fluid cooling circuit 174 of FIG. 4 is configured internal to (e.g., formed within, embedded within) a body 176 of the cooling plate 138. The fluid cooling circuit 174 of FIG. 4 extends (e.g., completely) within the cooling plate 138 between (a) a cooling circuit inlet 178 into the cooling plate 138 and its fluid cooling circuit 174 and (b) a cooling circuit outlet 180 out from the cooling plate 138 and its fluid cooling circuit 174. The fluid cooling circuit 174 of FIG. 4 includes an inlet manifold 182, an outlet manifold 184 and one or more heat exchange passages 186. This fluid cooling circuit 174 also includes an inlet passage 188 and an outlet passage 190.

The cooling circuit inlet 178 of FIG. 4 is disposed at the plate first side 154. The inlet passage 188 of FIG. 4 projects circumferentially into the cooling plate 138 from the cooling circuit inlet 178 to the inlet manifold 182. The present disclosure, however, is not limited to such an exemplary arrangement. The cooling circuit inlet 178, for example, may be disposed at the plate second side 156. In another example, the cooling circuit inlet 178 may be disposed at one of the plate ends 150, 152, and the inlet passage 188 may project axially into the cooling plate 138 from the cooling circuit inlet 178 to the inlet manifold 182. Moreover, while the inlet passage 188 is shown in FIG. 4 with a substantially straight-line longitudinal trajectory, it is contemplated the longitudinal trajectory of the inlet passage 188 may alternatively include one or more bends depending on, for example, relative locations between the cooling circuit inlet 178 and the inlet manifold 182.

The cooling circuit outlet 180 of FIG. 4 is disposed at the plate first side 154. The outlet passage 190 of FIG. 4 projects circumferentially into the cooling plate 138 from the cooling circuit outlet 180 to the outlet manifold 184. The present disclosure, however, is not limited to such an exemplary arrangement. For example, while the cooling circuit outlet 180 and the cooling circuit inlet 178 are arranged to a common side of the cooling plate 138 (the plate first side 154 of FIG. 4), the cooling circuit outlet 180 and the cooling circuit inlet 178 may alternatively be disposed at different sides of the cooling plate 138. In another example, the cooling circuit outlet 180 may be disposed at the plate second side 156. In still another example, the cooling circuit outlet 180 may be disposed at one of the plate ends 150, 152, and the outlet passage 190 may project axially into the cooling plate 138 from the cooling circuit outlet 180 to the outlet manifold 184. Moreover, while the outlet passage 190 is shown in FIG. 4 with a substantially straight-line longitudinal trajectory, it is contemplated the longitudinal trajectory of the outlet passage 190 may alternatively include one or more bends depending on, for example, relative locations between the cooling circuit outlet 180 and the outlet manifold 184.

The inlet manifold 182 and the outlet manifold 184 of FIG. 4 are disposed to opposing sides of an array of the heat exchange passages 186. In the specific arrangement of FIG. 4, the inlet manifold 182 is located between the heat exchange passage array and the plate second side 156. The outlet manifold 184 is located between the heat exchange passage array and the plate first side 154. The present disclosure, however, is not limited to such an exemplary arrangement. The locations of the inlet manifold 182 and the outlet manifold 184, for example, may be reversed. Each circuit manifold 182, 184 extends longitudinally within the cooling plate 138 along a respective side of the heat exchange passage array. As the inlet manifold 182 extends longitudinally from a base end fluidly coupled to the inlet passage 188 to an opposing distal end, a lateral width 192 of the inlet manifold 182 may (e.g., continuously or incrementally) decrease. Similarly, as the outlet manifold 184 extends longitudinally from a base end fluidly coupled to the outlet passage 190 to an opposing distal end, a lateral width 194 of the outlet manifold 184 may (e.g., continuously or incrementally) decrease.

Figure 6:
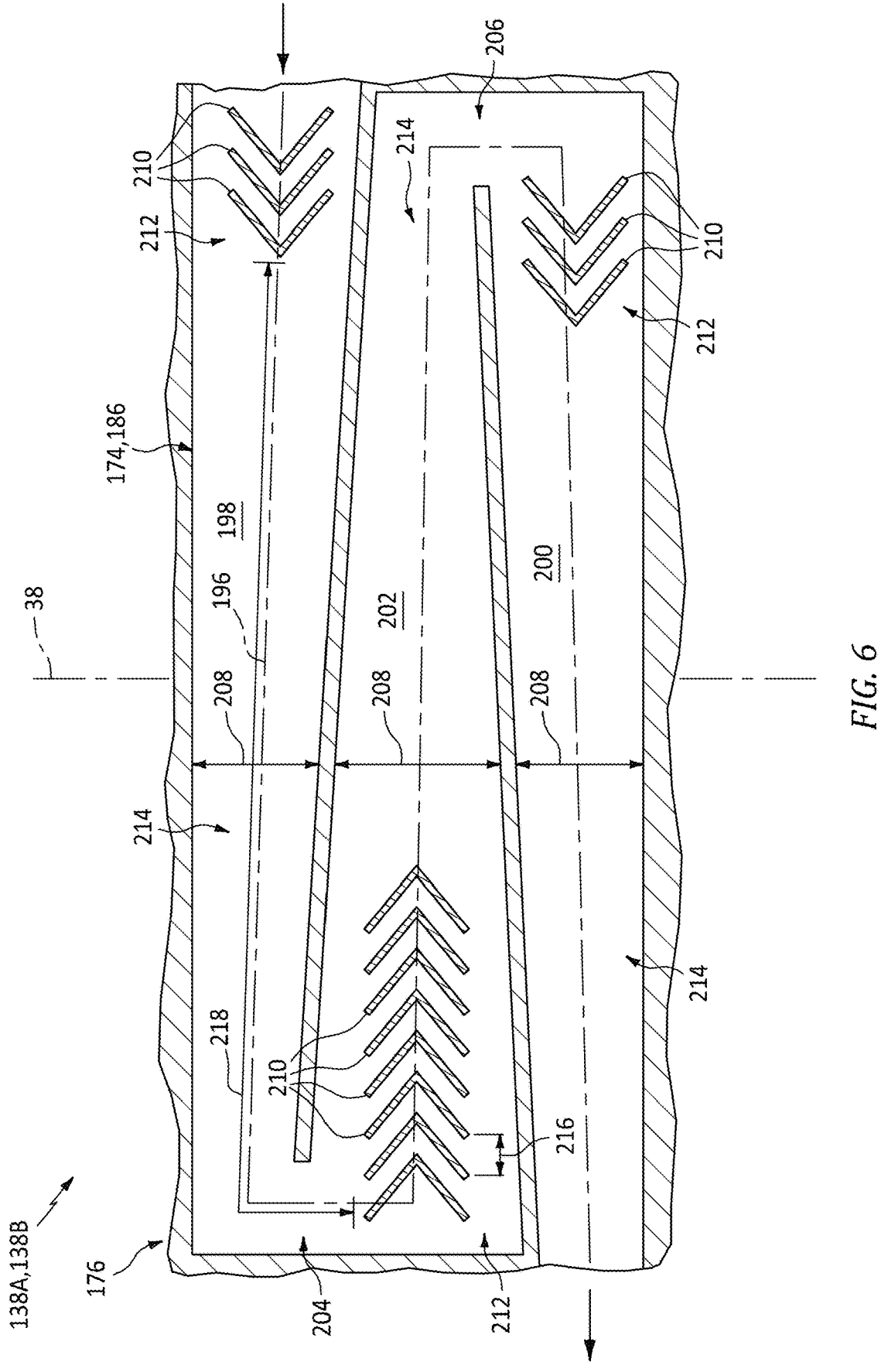
FIG. 6 is a partial sectional plan view illustration of the fluid cooling plate at a heat exchange passage.

Each heat exchange passage 186 of FIG. 4 extends longitudinally along a longitudinal centerline 196 (see FIG. 6) of the respective heat exchange passage 186 from the inlet manifold 182 to the outlet manifold 184. The heat exchange passages 186 of FIG. 4 are thereby arranged in parallel between and fluidly couple the inlet manifold 182 and the outlet manifold 184. Referring to FIG. 6, each heat exchange passage 186 and its longitudinal centerline 196 may follow a tortuous trajectory; e.g., a serpentine trajectory, a back and forth trajectory, a wavy trajectory, etc. The heat exchange passage 186 of FIG. 6, for example, includes an inlet leg 198, an outlet leg 200 and an intermediate leg 202. The inlet leg 198 extends circumferentially within the cooling plate 138 from the inlet manifold 182 (see FIG. 4) to an intersection 204 with an upstream end of the intermediate leg 202. The outlet leg 200 extends circumferentially within the cooling plate 138 from the outlet manifold 184 (see FIG. 4) to an intersection 206 with a downstream end of the intermediate leg 202. The intermediate leg 202 extends circumferentially within the cooling plate 138 from the inlet-to-intermediate leg intersection 204 to the outlet-to-intermediate leg intersection 206. With this arrangement, the intermediate leg 202 is disposed axially between the inlet leg 198 and the outlet leg 200. The intermediate leg 202 also extends circumferentially along and thereby circumferentially overlaps (e.g., substantially an entirety of) the inlet leg 198 and (e.g., substantially an entirety of) the outlet leg 200.

Each heat exchange passage 186 of FIG. 6 has a lateral (passage) width 208. This passage width 208 is a width of the heat exchange passage 186 measured perpendicular to the longitudinal centerline 196 of the respective heat exchange passage 186 in a reference plane; e.g., a plane parallel to the respective controller land 170 axially and circumferentially overlapping the respective heat exchange passage 186. The passage width 208 may change as the respective heat exchange passage 186 extends longitudinally along its longitudinal centerline 196 from (or about) the inlet manifold 182 to (or about) the outlet manifold 184 (see FIG. 4). The passage width 208 of FIG. 6, for example, decreases as the inlet leg 198 extends longitudinally along the longitudinal centerline 196 from (or about) the inlet manifold 182 (see FIG. 4) to (or about) the inlet-to-intermediate leg intersection 204. The passage width 208 of FIG. 6 decreases as the intermediate leg 202 extends longitudinally along the longitudinal centerline 196 from (or about) the inlet-to-intermediate leg intersection 204 to (or about) the outlet-to-intermediate leg intersection 206. The passage width 208 of FIG. 6 decreases as the outlet leg 200 extends longitudinally along the longitudinal centerline 196 from (or about) the outlet-to-intermediate leg intersection 206 to (or about) the outlet manifold 184 (see FIG. 4). However, at the inlet-to-intermediate leg intersection 204 and/or at the outlet-to-intermediate leg intersection 206, the passage width 208 may be increased. With such an arrangement, the passage width 208 of the inlet leg 198 proximate the inlet manifold 182 (see FIG. 4) may be (e.g., substantially or exactly) equal to (a) the passage width 208 of the intermediate leg 202 proximate the inlet-to-intermediate leg intersection 204 and/or (b) the passage width 208 of the outlet leg 200 proximate the outlet-to-intermediate leg intersection 206. Similarly, the passage width 208 of the inlet leg 198 proximate the inlet-to-intermediate leg intersection 204 may be (e.g., substantially or exactly) equal to (a) the passage width 208 of the intermediate leg 202 proximate the outlet-to-intermediate leg intersection 206 and/or (b) the passage width 208 of the outlet leg 200 proximate the outlet manifold 184 (see FIG. 4). The passage width 208 of the heat exchange passage 186 of FIG. 6 may thereby decrease, then increase, then decrease, then increase and then decrease again as that heat exchange passage 186 extends longitudinally away from the inlet manifold 182 and towards the outlet manifold 184 (see FIG. 4).

One or more or all of the passage legs 198, 200 and/or 202 may each be configured with one or more cooling elements 210. For ease of description, these cooling elements 210 are described below as elongated protrusions; e.g., trip strips, ribs, chevrons, etc. One or more of the cooling elements 210, however, may alternatively be configured as pedestals or other protrusions and/or depressions configured to turbulate the cooling fluid flowing through the respective heat exchange passage 186. Each passage leg 198, 200, 202 of FIG. 6, in particular, includes an augmented flow section 212 and a free flow section 214, where the augmented flow section 212 is configured with a set of one or more of the cooling elements 210.

The augmented flow section 212 is located at (or near) an upstream end of the respective passage leg 198, 200, 202. This augmented flow section 212 is configured with the set of the cooling elements 210 arranged, for example, longitudinally along the longitudinal centerline 196. Here, each neighboring pair of the cooling elements 210 in the respective cooling element set are spaced apart longitudinally along the longitudinal centerline 196 by a longitudinal inter-element distance 216.

Each free flow section 214 may be configured as a section of the heat exchange passage 186 and its passage leg 198, 200, 202 without any cooling elements. The free flow section 214 of the inlet leg 198 extends longitudinally along the longitudinal centerline 196 from the augmented flow section 212 of the inlet leg 198 to the augmented flow section 212 of the intermediate leg 202. H ere, the free flow section 214 is an intermediate section between the augmented flow section 212 of the inlet leg 198 and the augmented flow section 212 of the intermediate leg 202. The free flow section 214 of the intermediate leg 202 extends longitudinally along the longitudinal centerline 196 from the augmented flow section 212 of the intermediate leg 202 to the augmented flow section 212 of the outlet leg 200. H ere, the free flow section 214 is an intermediate section between the augmented flow section 212 of the intermediate leg 202 and the augmented flow section 212 of the outlet leg 200. The free flow section 214 of the outlet leg 200 extends longitudinally along the longitudinal centerline 196 from the augmented flow section 212 of the outlet leg 200 to outlet manifold 184 (see FIG. 4).

A longitudinal length 218 of each free flow section 214 may be sized greater than the longitudinal inter-element distance 216. An average and/or minimum size of the passage width 208 along each free flow section 214 may be less than an average and/or minimum size of the passage width 208 along the neighboring upstream and/or downstream augmented flow section(s) 212. The passage width 208 along each free flow section 214, for example, may decrease in size as that free flow section 214 extends longitudinally away from the neighboring upstream augmented flow section 212. With this arrangement, fluid pressure loss across the cooling elements 210 may be at least partially recovered along the neighboring downstream free flow section 214.

Each free flow section 214 of FIG. 6 is circumferentially next to the neighboring upstream augmented flow section 212. Each free flow section 214 of FIG. 6 also circumferentially overlaps another one of the augmented flow sections 212.

Figure 7:
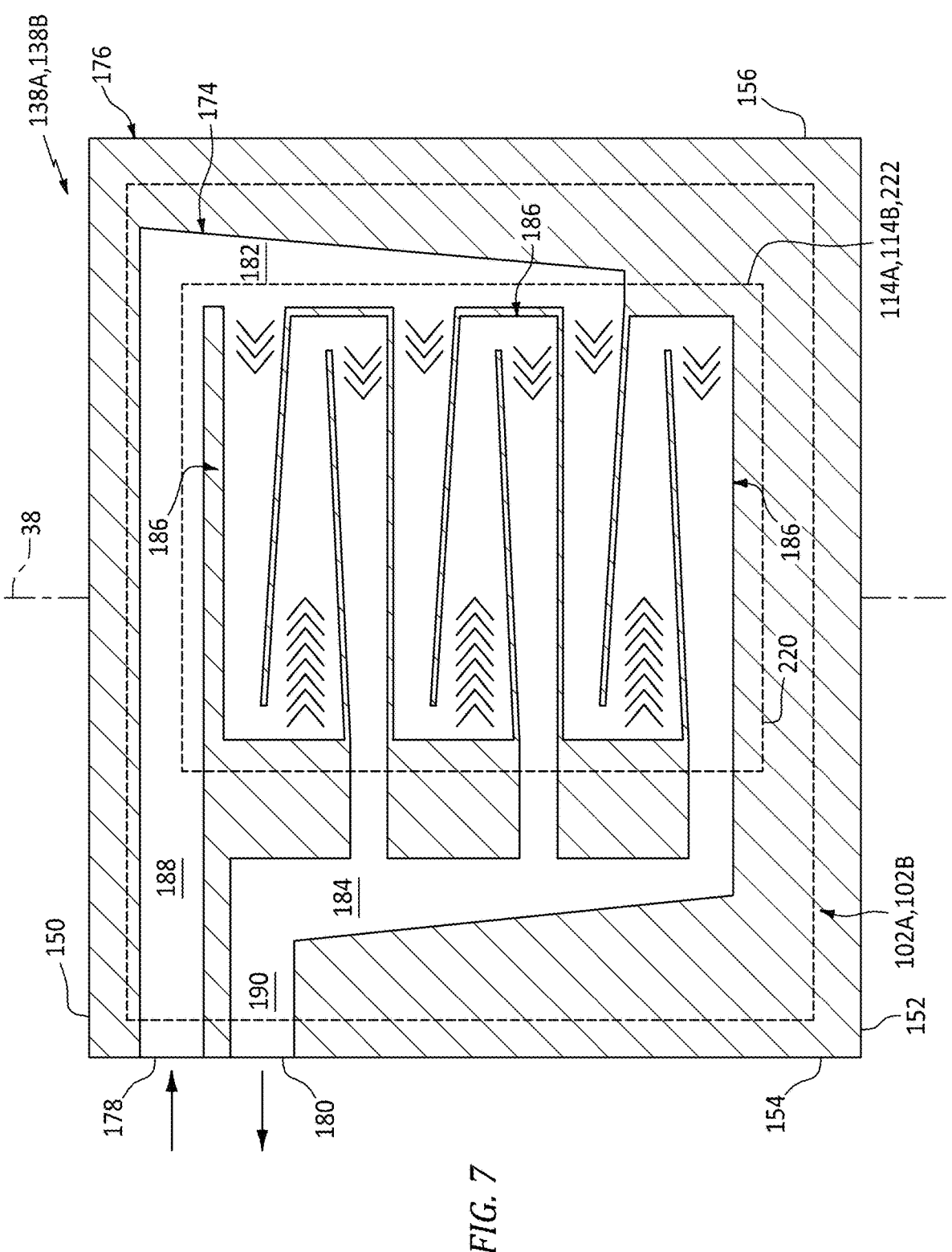
FIG. 7 is a sectional plan view illustration of the fluid cooling plate with another electric machine controller arrangement.

Referring to FIG. 4, the array of the heat exchange passages 186 define a heat exchange region 220 (e.g., a heat exchange footprint) along the controller land 170. The fluid cooling circuit 174 and its heat exchange passages 186 may be arranged to provide the heat exchange region 220 with a shape that matches (e.g., is the same as, substantially resembles, etc.) a shape of a portion of the respective EM controller 102 and its controller housing 112 that engages the controller land 170 (see FIG. 5), for example when viewed in the reference plane. The fluid cooling circuit 174 and its heat exchange passages 186 may also or alternatively be arranged to provide the heat exchange region 220 with a footprint area that is equal to or within ten percent (10%) or five percent (5%) of a footprint area of the portion of the respective EM controller 102 and its controller housing 112 that engages the controller land 170 (see FIG. 5), for example when viewed in the reference plane. Alternatively, referring to FIG. 7, the shape of the heat exchange region 220 may match a shape of a component 222 (e.g., a circuit board) of the controller circuitry 114 to be cooled, for example when viewed in the reference plane. The footprint area of the heat exchange region 220 may also or alternatively be equal to or within ten percent (10%) or five percent (5%) of a footprint area of the component 222 (e.g., a circuit board) of the controller circuitry 114 to be cooled, for example when viewed in the reference plane. With such arrangements of FIGS. 4 and 7, the fluid cooling circuit 174 and its heat exchange passages 186 are tailored to direct cooling to a specific region of the cooling plate 138. The fluid cooling circuit 174 and its heat exchange passages 186 are thereby operable to flow a quantity of the cooling fluid within the cooling plate 138 in close proximity and in thermal communication with the respective EM controller 102 and its controller circuitry 114.

Referring to FIG. 3, during operation of the fluid cooling system 36, the fluid pump 136 directs (e.g., pumps) relatively cool cooling fluid out of the fluid reservoir 134, through the cooling system flowpath 130, to the cooling plates 138. Referring to FIG. 5, as the cooling fluid flows through the fluid cooling circuit 174 and its heat exchange passages 186 within each cooling plate 138, heat energy generated by the controller circuitry 114 may be transferred out of the EM controller 102 and into the cooling fluid. The heat energy transfer thereby dissipates the heat energy in (e.g., cools) the respective EM controller 102 and its controller circuitry 114 while also heating the cooling fluid. Referring to FIG. 3, the now heated cooling fluid is directed from the cooling plates 138, through the cooling system flowpath 130, to the heat exchanger 132. Within the heat exchanger 132, at least some or all of the heat energy previously transferred into the cooling fluid at the cooling plates 138 may be transferred out of the cooling fluid into the other working fluid thereby cooling the cooling fluid. The now cooled cooling fluid is directed from the heat exchanger 132, through the cooling system flowpath 130, back into the fluid reservoir 134 of subsequent recirculation.

With the foregoing arrangement, each EM controller 102 of FIGS. 2 and 5 may be configured as a discrete line replaceable unit (LRU). For example, each EM controller 102 may be readily removed by a technician (a) by unplugging electrical connections (e.g., 224 and 226) to the respective EM controller 102 (see FIG. 2) and (b) removing the mechanical fasteners (see FIG. 5) to detach the respective EM controller 102 from the cooling plate 138. A replacement EM controller may then be readily installed (or the previous EM controller may be reinstalled) by attaching the respective EM controller 102 to the cooling plate 138 with the mechanical fasteners (see FIG. 5) and plugging in the electrical connections (e.g., 224 and 226) to the respective EM controller 102 (see FIG. 2). Since the cooling system flowpath 130 and its fluid cooling circuit 174 of FIG. 3 run through the respective cooling plate 138, the cooling system flowpath 130 is fluidly discrete and fluidly isolated from the EM controller 102. Each EM controller 102 may thereby be removed and installed without breaking or making any fluid connections. Thus, while the fluid cooling system 36 is operable to regulate the temperatures of the EM controllers 102, the fluid cooling system 36 is mechanically discrete from the EM controllers 102 to facilitate assembly, maintenance and inspection of the EM controllers 102.

Figure 8:
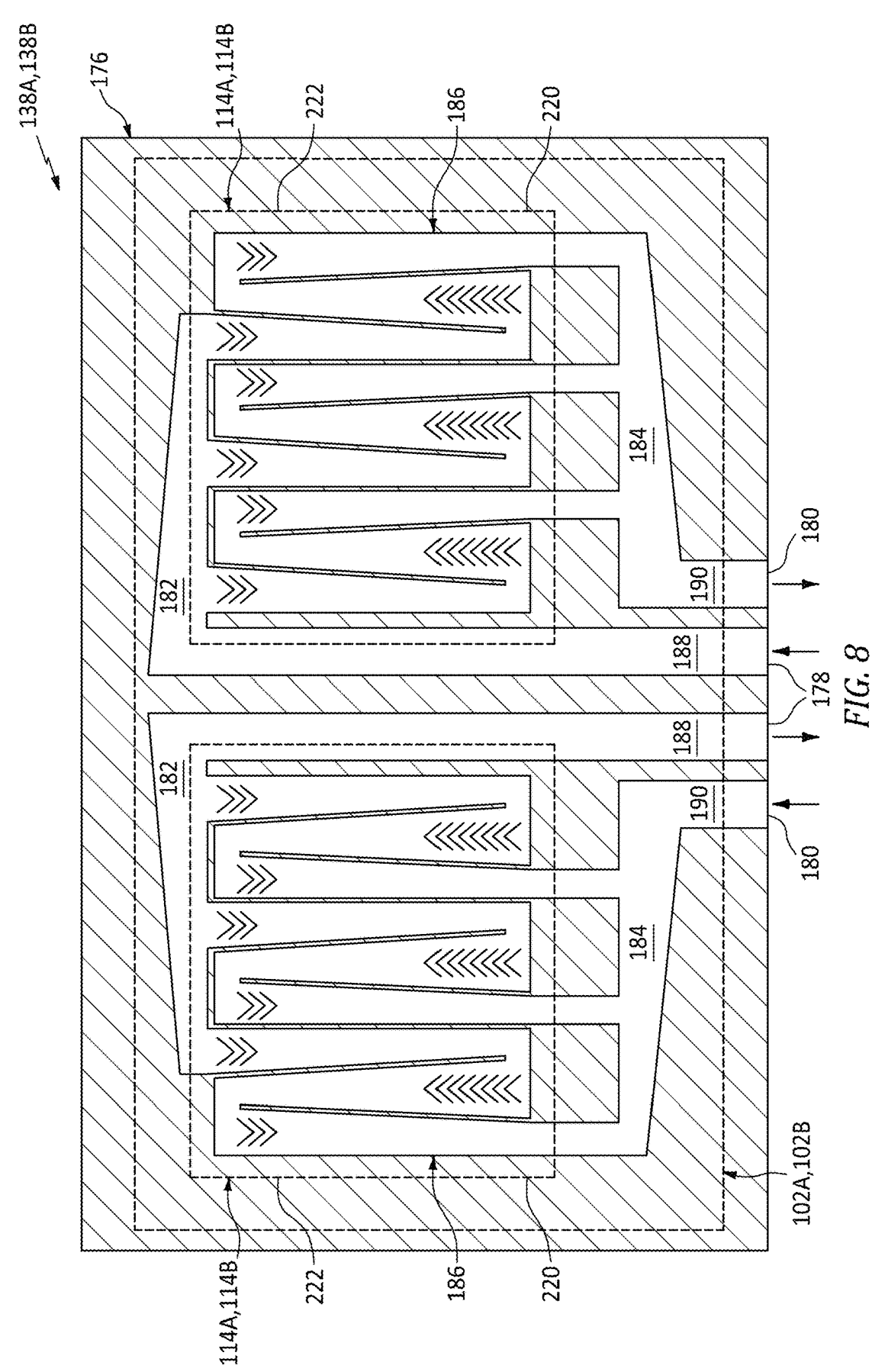
FIGS. 8 and 9 are sectional plan view illustrations of the fluid cooling plate with multiple fluid cooling circuits.
Figure 9:
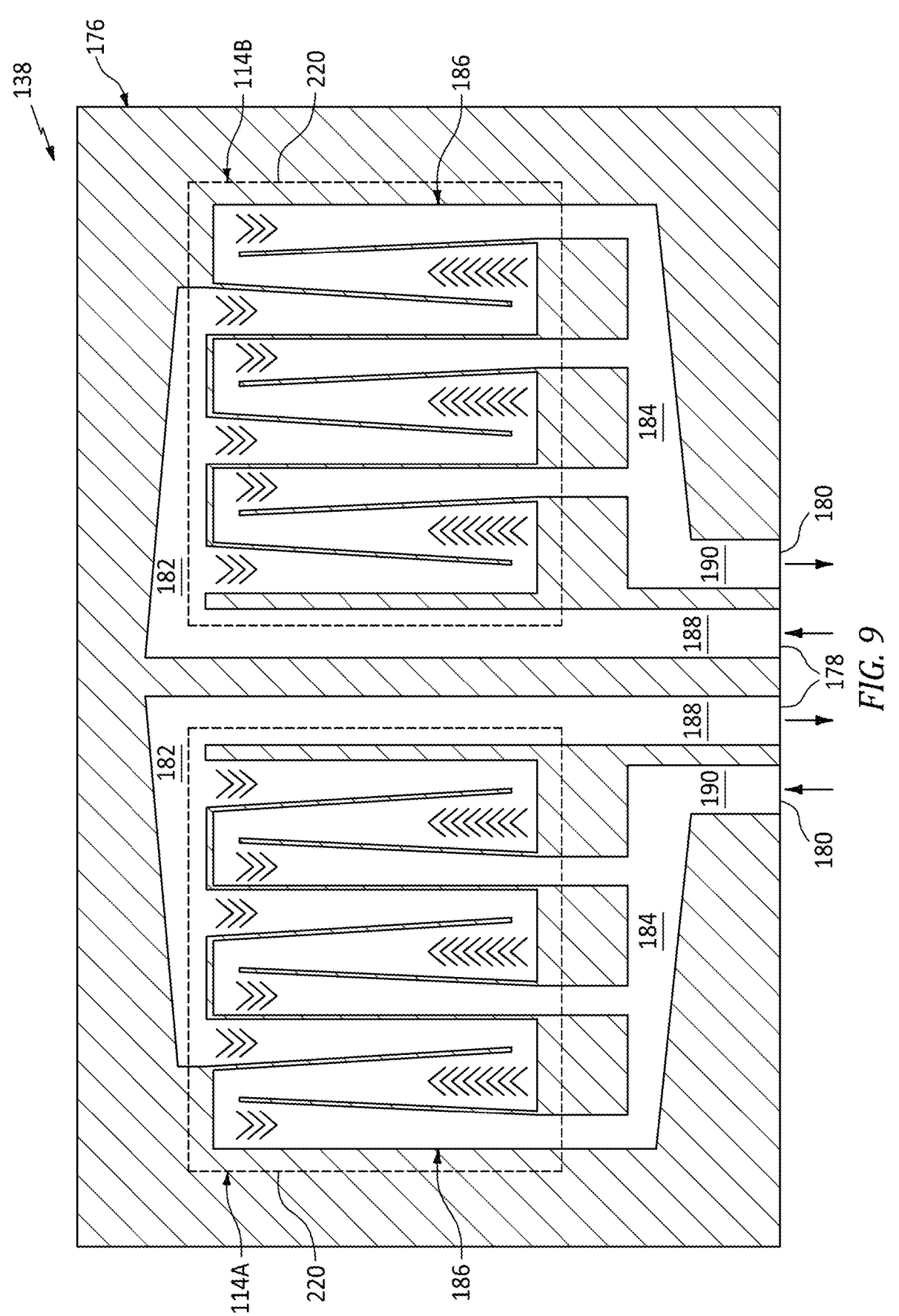

In some embodiments, referring to FIG. 4, each cooling plate 138 may include a single array of the heat exchange passages 186 and, thus, a single heat exchange region 220. In other embodiments, referring to FIGS. 8 and 9, a cooling plate 138 may be configured with multiple of the heat exchange regions 220. Each of these heat exchange regions 220 may be configured as described above. Referring to FIG. 8, the multiple heat exchange regions 220 may be configured to service a single one of the EM controllers 102. Each heat exchange region 220 of FIG. 8, for example, may be below and configured in thermal communication with a different component 222 (e.g., a circuit board) of the controller circuitry 114. Alternatively, referring to FIG. 9, the multiple heat exchange regions 220 may be configured to respectively service multiple EM controllers 102. Each heat exchange region 220 of FIG. 9, for example, may be below and configured in thermal communication with one of the EM controllers 102. With this arrangement, a single cooling plate 138 may be used to service multiple EM controllers 102.

Figure 10:
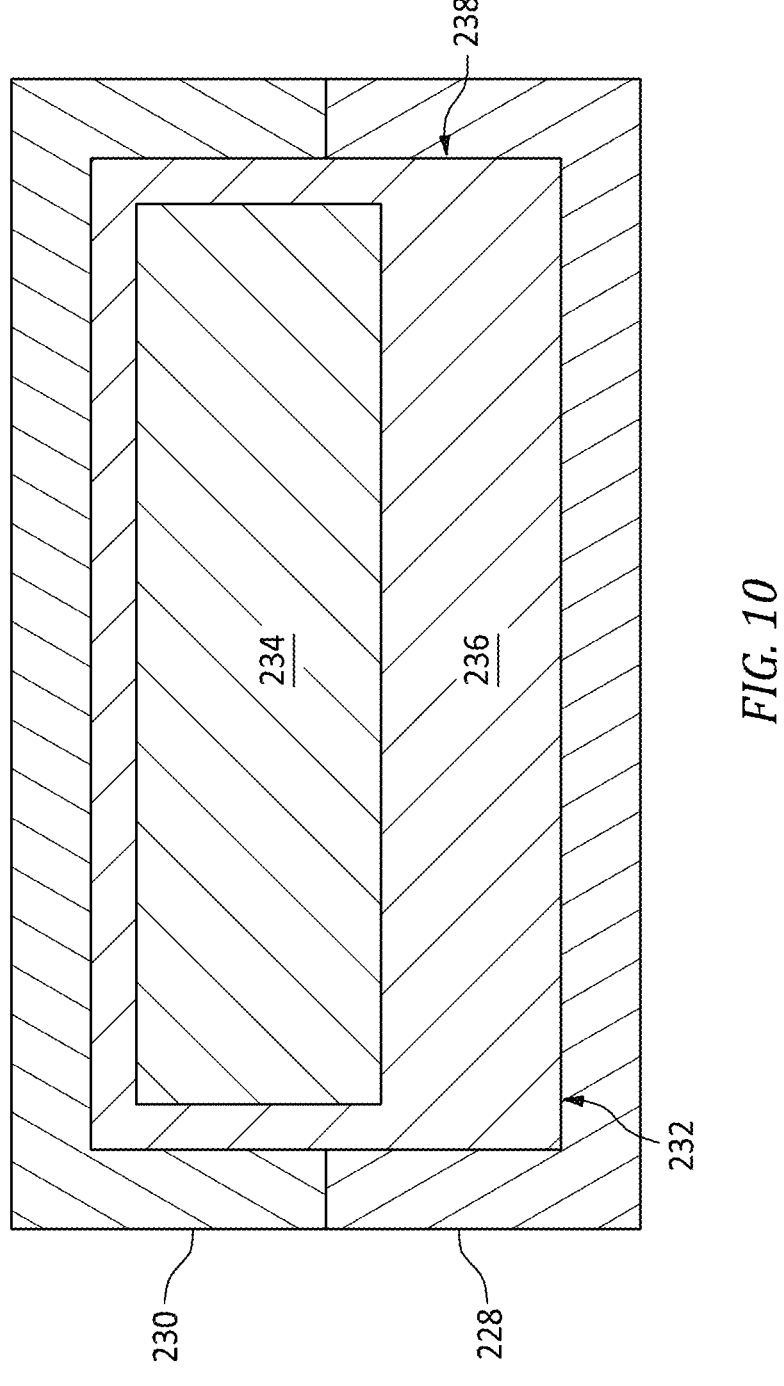
FIG. 10 is a schematic illustration of an investment casting process step.

In some embodiments, referring to FIG. 5, the cooling plate 138 and its body 176 may be monolithic. The cooling plate 138, for example, may be formed using an investment casting process. Referring to FIG. 10, during such an investment casting process, first and second casting forms 228 and 230 (e.g., bottom and top dies) may be mated together to provide an internal casting cavity 232. At least one casting core 234 (e.g., a ceramic core, a refractory metal core, etc.) may be disposed within the casting cavity 232. During the investment casting process, material 236 such as liquid metal is directed into the casting cavity 232 and fills open spaces between the casting forms 228 and 230 and the casting core 234. After the material 236 has been solidified, the casting forms 228 and 230 are removed to reveal a preform cooling plate 238. The casting core 234 is then removed from the interior of the preform cooling plate 238 to provide a cooling plate 138 with its internal fluid cooling circuit 174. Here, the fluid cooling circuit 174 is a negative produced by the removal of the casting core 234. By forming the cooling plate 138 using such an investment casting process, referring to FIG. 5, a height 240 of the heat exchange passages 186 may be relatively small and a wall thickness 242 between those heat exchange passages 186 and the controller land 170 may be relatively small. More particularly, the passage height 240 and the wall thickness 242 may be smaller than may be possible using other manufacturing operations. The present disclosure, however, is not limited to investment casting, particularly where additional room of the cooling plate(s) may be available.

While each cooling plate 138 of FIG. 5 and its associated components are described above as being disposed within the outer housing compartment 90 (see also FIG. 1), the present disclosure is not limited to such an exemplary arrangement. For example, each cooling plate 138 and its associated components may alternatively be disposed within another compartment within the aircraft propulsion system 22, a compartment within a pylon structure for the aircraft propulsion system 22, or the like. For example, where the aircraft propulsion system 22 is an open rotor propulsion system without an outer case as shown in FIG. 1, each cooling plate 138 and its associated components may be disposed within the inner housing compartment 84.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. An assembly for an aircraft powerplant, comprising:
a cooling plate comprising a fluid cooling circuit internal to a body of the cooling plate, the fluid cooling circuit including an inlet manifold, an outlet manifold and a plurality of heat exchange passages, each of the plurality of heat exchange passages comprising a longitudinal centerline and extending longitudinally along the longitudinal centerline from the inlet manifold to the outlet manifold, the plurality of heat exchange passages comprising a first heat exchange passage, and the first heat exchange passage configured with a plurality of first cooling elements arranged longitudinally along the longitudinal centerline of the first heat exchange passage; and
an electric machine controller including a controller housing and controller circuitry, the controller housing removably attached to the cooling plate and overlapping the plurality of heat exchange passages, the controller circuitry disposed within an interior of the controller housing, and the controller circuitry in thermal communication with the cooling plate through a wall of the controller housing.

2. The assembly of claim 1, wherein the body of the cooling plate is a monolithic body.

3. The assembly of claim 1, wherein the longitudinal centerline of the first heat exchange passage follows a tortuous trajectory.

4. The assembly of claim 1, wherein the first heat exchange passage includes
a first augmented flow section configured with a first set of the plurality of first cooling elements;
a second augmented flow section configured with a second set of the plurality of first cooling elements; and
an intermediate flow section longitudinally between the first augmented flow section and the second augmented flow section.

5. The assembly of claim 4, wherein a longitudinal length of the intermediate flow section along the longitudinal centerline of the first heat exchange passage is greater than
a longitudinal inter-element distance between a neighboring pair of the plurality of first cooling elements disposed in the first set of the plurality of first cooling elements; and
a longitudinal inter-element distance between a neighboring pair of the plurality of first cooling elements disposed in the second set of the plurality of first cooling elements.

6. The assembly of claim 4, wherein the intermediate flow section is configured without any cooling elements.

7. The assembly of claim 4, wherein a minimum lateral width of the intermediate flow section along the longitudinal centerline of the first heat exchange passage is less than

20 a minimum lateral width of the first augmented flow section along the longitudinal centerline of the first heat exchange passage; and
a minimum lateral width of the second augmented flow section along the longitudinal centerline of the first heat exchange passage.

8. The assembly of claim 4, wherein a lateral width of the intermediate flow section decreases as the intermediate flow section extends longitudinally along the longitudinal centerline of the first heat exchange passage away from the first augmented flow section towards the second augmented flow section.

9. The assembly of claim 4, wherein the intermediate flow section overlaps the second augmented flow section within the body of the cooling plate.

10. The assembly of claim 1, wherein a lateral width of the first heat exchange passage decreases, then increases and then decreases as the first heat exchange passage extends longitudinally away from the inlet manifold and towards outlet manifold.

11. The assembly of claim 1, wherein a lateral width of the first heat exchange passage decreases, then increases, then decreases, then increases and then decreases as the first heat exchange passage extends longitudinally away from the inlet manifold and towards outlet manifold.

12. The assembly of claim 1, wherein the first heat exchange passage includes
a first passage leg;
a second passage leg; and
a third passage leg longitudinally between and fluidly coupling the first passage leg and the second passage leg, the third passage leg overlapping the first passage leg and the second passage leg along a first direction, and the third passage leg between the first passage leg and the second passage leg along a second direction that is perpendicular to the first direction.

13. The assembly of claim 1, wherein the cooling plate has an exterior surface, the plurality of heat exchange passages define a heat exchange region along the exterior surface, and at least one of
a shape of the heat exchange region matches a shape of a portion of the electric machine controller that engages the exterior surface in a reference plane parallel to the exterior surface; or
an area of the heat exchange region is within ten percent of an area of the portion of the electric machine controller that engages the exterior surface in the reference plane.

14. The assembly of claim 1, wherein the cooling plate has an exterior surface that engages the electric machine controller, the plurality of heat exchange passages define a heat exchange region along the exterior surface, and at least one of
a shape of the heat exchange region matches a shape of a circuit board of the controller circuitry in a reference plane parallel to the exterior surface; or
an area of the heat exchange region is within ten percent of an area of the circuit board of the controller circuitry in the reference plane.

15. The assembly of claim 1, wherein the cooling plate further includes
a second inlet manifold, a second outlet manifold and a plurality of second heat exchange passages;
each of the plurality of second heat exchange passages extending longitudinally from the second inlet manifold to the second outlet manifold;

the controller circuitry including a first circuit board and a second circuit board;

the first circuit board overlapping the plurality of heat exchange passages; and the second circuit board overlapping the plurality of second heat exchange passages.

16. The assembly of claim 1, further comprising:

a second electric machine controller including a second controller housing and second controller circuitry;

the cooling plate further including a second inlet manifold, a second outlet manifold and a plurality of second heat exchange passages, and each of the plurality of second heat exchange passages extending longitudinally from the second inlet manifold to the second outlet manifold; and the second controller housing removably attached to the cooling plate and overlapping the plurality of second heat exchange passages, the second controller circuitry disposed within an interior of the second controller housing, and the second controller circuitry in thermal communication with the cooling plate through a wall of the second controller housing.

17. The assembly of claim 1, further comprising:

a cooling system including the cooling plate, a heat exchanger and a cooling loop;

the cooling loop including and extending through the fluid cooling circuit and one or more passages within the heat exchanger; and the cooling system configured to circulate a cooling fluid through the cooling loop between the cooling plate and the heat exchanger.

18. The assembly of claim 1, further comprising:

an electrical system; and an electric machine electrically coupled to the electrical system through the electric machine controller, the controller circuitry configured to control a flow of electricity between the electrical system and the electric machine.

19. An assembly for an aircraft powerplant, comprising:

a cooling plate comprising a fluid cooling circuit internal to a monolithic body of the cooling plate, the fluid cooling circuit including an inlet manifold, an outlet manifold and a plurality of heat exchange passages, each of the plurality of heat exchange passages comprising a longitudinal centerline and extending longitudinally along the longitudinal centerline from the inlet manifold to the outlet manifold, the plurality of heat exchange passages comprising a first heat exchange passage, the longitudinal centerline of the first heat exchange passage following a serpentine trajectory, and a lateral width of the first heat exchange passage changing as the first heat exchange passage extends longitudinally along the longitudinal centerline of the first heat exchange passage between the inlet manifold and the outlet manifold; and an electric machine controller including a controller housing and controller circuitry, the controller housing attached to the cooling plate, the controller circuitry disposed within an interior of the controller housing and overlapping the plurality of heat exchange passages, and the controller circuitry in thermal communication with the cooling plate through an interface between the electric machine controller and the cooling plate.

20. A method of manufacture, comprising:

forming a metal cooling plate for an aircraft powerplant using investment casting to provide the metal cooling plate with a cast monolithic body;

wherein the metal cooling plate comprises a fluid cooling circuit internal to the cast monolithic body, the fluid cooling circuit includes an inlet manifold, an outlet manifold and a plurality of heat exchange passages, each of the plurality of heat exchange passages comprises a longitudinal centerline and extends longitudinally along the longitudinal centerline from the inlet manifold to the outlet manifold, the plurality of heat exchange passages comprise a first heat exchange passage, and the first heat exchange passage is configured with a plurality of first cooling elements arranged longitudinally along the longitudinal centerline of the first heat exchange passage; and wherein the metal cooling plate is configured to support an electric machine controller, the electric machine controller includes a controller housing and controller circuitry, the controller housing is removably attached to the metal cooling plate and overlaps the plurality of heat exchange passages, the controller circuitry is disposed within an interior of the controller housing, and the controller circuitry is configurable in thermal communication with the metal cooling plate through a wall of the controller housing when supported by the metal cooling plate.

* * * * *